(12) United States Patent
Murakami et al.

(10) Patent No.: US 11,118,110 B2
(45) Date of Patent: Sep. 14, 2021

(54) STRIPPING LIQUID, STRIPPING METHOD, AND ELECTRONIC-COMPONENT FABRICATING METHOD

(71) Applicants: KABUSHIKI KAISHA TOSHIBA, Minato-ku (JP); Toshiba Electronic Devices & Storage Corporation, Minato-ku (JP)

(72) Inventors: Yukako Murakami, Chigasaki (JP); Ikuo Uematsu, Yokohama (JP)

(73) Assignees: KABUSHIKI KAISHA TOSHIBA, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 0 days.

(21) Appl. No.: 16/668,324

(22) Filed: Oct. 30, 2019

(65) Prior Publication Data

US 2020/0140753 A1 May 7, 2020

(30) Foreign Application Priority Data

Nov. 1, 2018 (JP) .............................. JP2018-206891

(51) Int. Cl.
*C09K 13/00* (2006.01)
*C09J 125/14* (2006.01)
(Continued)

(52) U.S. Cl.
CPC .............. *C09K 13/00* (2013.01); *C09J 125/14* (2013.01); *C09J 133/062* (2013.01);
(Continued)

(58) Field of Classification Search
CPC ........................ C09J 125/14; C09J 133/062; C09J 2205/302; C09J 2301/502; C09K 13/00; H01L 21/31133; H01L 21/6835; H01L 2221/68327; H01L 2221/68381; H01L 21/02043; H01L 21/02052; H01L 21/02057
(Continued)

(56) References Cited

U.S. PATENT DOCUMENTS 5,582,902 A * 12/1996 Kanbayashi ......... G03G 7/0013
346/135.1
9,482,957 B1 11/2016 Lin
(Continued)

FOREIGN PATENT DOCUMENTS

GB 786583 11/1957
JP 2014-49698 A 3/2014
(Continued)

*Primary Examiner* — Lan Vinh
(74) *Attorney, Agent, or Firm* — Oblon, McClelland, Maier & Neustadt, L.L.P.

(57) ABSTRACT

According to one embodiment, a stripping liquid is provided. The stripping liquid is for removing a support plate from a stack. The stack includes a substrate, the support plate, and an adhesive. The Adhesive is placed between the substrate and the support plate. The adhesive includes a compound. The compound has a first functional group and a second functional group differing from each other. The stripping liquid includes a first solvent and a second solvent. The second solvent have a polarity higher than the first solvent.

10 Claims, 5 Drawing Sheets

(51) Int. Cl.
*C09J 133/06* (2006.01)
*H01L 21/683* (2006.01)

(52) U.S. Cl.
CPC ..... *H01L 21/6835* (2013.01); *C09J 2301/502* (2020.08); *H01L 2221/68381* (2013.01)

(58) Field of Classification Search
USPC ............... 216/13, 33, 88, 38; 134/1.2, 1.3; 252/79.1, 79.2, 79.3
See application file for complete search history.

(56) References Cited

U.S. PATENT DOCUMENTS

| | | | |
|---|---|---|---|
| 2010/0112728 A1* | 5/2010 | Korzenski | C09K 13/08 438/3 |
| 2011/0259527 A1 | 10/2011 | Nakada et al. | |
| 2015/0013917 A1* | 1/2015 | Inao | H01L 21/02057 156/703 |
| 2016/0101028 A1* | 4/2016 | Wolff | A61K 8/39 510/130 |
| 2017/0148659 A1* | 5/2017 | Yoshioka | B32B 7/06 |

FOREIGN PATENT DOCUMENTS

| | | |
|---|---|---|
| JP | 5576702 B2 | 8/2014 |
| WO | WO 2014/030687 A1 | 2/2014 |
| WO | WO 2010/127941 A1 | 11/2020 |

\* cited by examiner

STRIPPING LIQUID, STRIPPING METHOD, AND ELECTRONIC-COMPONENT FABRICATING METHOD

CROSS-REFERENCE TO RELATED APPLICATIONS

This application is based upon and claims the benefit of priority from Japanese Patent Application No. 2018-206891, filed Nov. 1, 2018, the entire contents of which is incorporated herein by reference.

FIELD

Embodiments described herein relate generally to a stripping liquid, a stripping method, and an electronic-component fabricating method.

BACKGROUND

Upgrading and downsizing electronic apparatuses have been advancing in these years. Naturally, semiconductor chips for installation in electronic apparatuses are desired to be smaller and thinner. One way to provide thinner semiconductor chips is to reduce the thickness of a semiconductor wafer as a substrate.

This, however, could incur damages during conveyance since reduction in thickness of a semiconductor wafer is synonymous with decrease in its strength. As a solution to such a drawback, a wafer handling system has been developed, where a semiconductor wafer is bonded with a support plate for conveyance.

The system involves, for example, the following steps. First, an adhesive is applied over one surface of a semiconductor wafer, and a support plate is attached onto the semiconductor wafer via the adhesive so as to obtain a stack. The stack is then automatically conveyed so that it undergoes processes such as a cutting process for the other surface of the semiconductor wafer, a semiconductor-device forming process for this other surface, and so on. After the processes, the stack is conveyed to a predetermined site and the support plate is removed from the stack using a stripping liquid.

DETAILED DESCRIPTION

Figure 1:
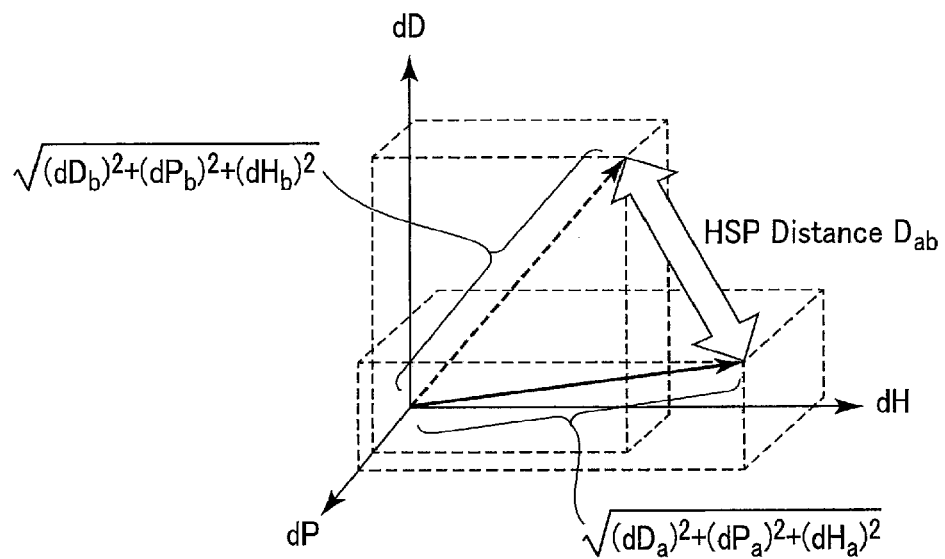
FIG. 1 is a diagram for explaining a Hansen solubility parameter (HSP)

According to one embodiment, a stripping liquid is provided. The stripping liquid is for removing a support plate from a stack. The stack includes a substrate, the support plate, and an adhesive. The Adhesive is placed between the substrate and the support plate. The adhesive includes a compound. The compound has a first functional group and a second functional group differing from each other. The stripping liquid includes a first solvent and a second solvent. The second solvent have a polarity higher than the first solvent.

According to another embodiment, a stripping method is provided. The stripping method includes removing a support plate from a stack by having the stripping liquid according to the embodiment contact the stack. The stack includes a substrate, the support plate, and an adhesive. The adhesive is placed between the substrate and the support plate. The adhesive includes a compound. The compound has a first functional group and a second functional group differing from each other.

According to another embodiment, an electronic-component fabricating method is provide. The electronic-component fabricating method includes removing a support plate from a stack by having the stripping liquid according to the embodiment contact the stack. The stack includes a substrate, the support plate, and an adhesive. The adhesive is placed between the substrate and the support plate. The adhesive includes a compound. The compound has a first functional group and a second functional group differing from each other.

According to the above approaches, a stripping liquid that allows for easy removal of a support plate from a stack including a substrate, the support plate, and an adhesive, stripping method, and an electronic-component fabricating method employing this stripping liquid are provided.

According to an embodiment, a stripping liquid is provided. The stripping liquid is for removing a support plate from a stack. The stack includes a substrate, the support plate, and an adhesive. The Adhesive is placed between the substrate and the support plate. The adhesive includes a compound. The compound has a first functional group and a second functional group differing from each other. The stripping liquid includes a first solvent and a second solvent. The second solvent have a polarity higher than the first solvent.

The stripping liquid according to the embodiment may be employed as a stripping liquid for an adhesive used in a wafer handling system which includes attaching a support plate to a semiconductor wafer and transporting it. The adhesive used in such a system is provided between a semiconductor wafer and a support plate to bond them together. The adhesive may contain two types of functional groups differing in polarity, i.e., low-polar functional groups with a relatively low polarity and high-polar functional groups with a relatively high polarity.

The stripping liquid according to the embodiment contains a mixture of two types of solvents differing in polarity, that is, it contains a mixed solvent formed of a low-polar solvent with a relatively low polarity and a high-polar solvent with a relatively high polarity. As such, when this stripping liquid contact the adhesive, the low-polar functional group can be solvated by molecules of the low-polar solvent having a relatively high affinity with the low-polar functional group, and the high-polar functional group can be solvated by molecules of the high-polar solvent having a relatively high affinity with the high-polar functional group.

Use of the stripping liquid according to the embodiment can therefore let the adhesive quickly dissolve or swell as compared to cases of using a low-polar solvent or a high-polar solvent alone, and consequently allows for easy removal of the support plate from the stack.

In particular, further suitable stripping liquids can be obtained through adjustment of the ratios of a low-polar solvent content and a high-polar solvent content therein according to the ratios of a low-polar functional group content and a high-polar functional group content in an adhesive, adjustment of the solubility parameter thereof according to the solubility parameter of an adhesive, and so on.

Now, the stripping liquid according to a certain embodiment will be described in more detail.

The stripping liquid according to the embodiment is intended to remove a support plate from a stack. The stack includes a substrate, a support plate, and an adhesive.

The substrate may be a wafer of single-element semiconductor, or a wafer of compound semiconductor. Element that constitutes the single-element semiconductor is, for example, silicon, germanium, selenium, or carbon. Compound that constitutes the compound semiconductor is, for example, silicon carbide (SiC), gallium phosphide (GaP), gallium arsenide (GaAs), gallium nitride (GaN), indium phosphide (InP), indium arsenide (InAs), or indium tin oxide (ITO).

One major surface of the substrate is applied with the later-described adhesive, followed by placement of a support plate thereon. At least one major surface of the substrate may have semiconductor devices (e.g., transistors), electrodes, etc.

The substrate is of a disk shape, for example. The substrate has a diameter of, for example, 200 mm or greater and 300 mm or less. The substrate has a thickness of, for example, 50 μm or greater and 1000 μm or less.

The support plate is attached onto one major surface of the substrate via the adhesive. The support plate is, for example, of a glass material such as alkali-free glass, of a resin material such as acrylic resin, or of a metal material. The support plate may be a semiconductor wafer.

The support plate is not limited to particular shapes. According to a certain example, the support plate is of a disk shape having substantially the same diameter as the substrate. The support plate has a diameter of, for example, 190 mm or greater and 300 mm or less. The support plate has a thickness of, for example, 600 μm or greater and 1000 μm or less.

The support plate may have multiple through-holes extending in the thickness direction. Providing multiple through-holes in the support plate enables the stripping liquid to contact the adhesive via these holes during the step of removing the support plate from the stack, and therefore, it can reduce the time to remove the support plate. The through-holes have, for example, a circular-profile cross section perpendicular to the extending direction thereof. Such through-holes each have a diameter of, for example, 250 μm or greater and 1500 μm or less.

The adhesive intervenes between the substrate and the support plate to unite them together. The adhesive contains a compound having a first functional group and a second functional group differing from each other. The second functional group has a polarity higher than that of the first functional group. Thus, the first functional group and the second functional group may be called a low-polar functional group and a high-polar functional group, respectively.

The first functional group is, for example, at least one selected from the group consisting of a phenyl group, an alkyl group, and an ether group.

The second functional group is, for example, at least one selected from the group consisting of a hydroxyl group, a carbonyl group, an ester group, an amino group, and a carboxyl group.

It is possible to use, for example, an infrared spectroscopic analysis to check if a subject adhesive contains the compound having the first and second functional groups.

The compound having the first functional group and the second functional group is, for example, at least one selected from the group consisting of a styrene-(meth)-acrylate copolymer, an ethylene-vinyl acetate copolymer, and a maleic anhydride-olefin copolymer.

Note that in the styrene-(meth)-acrylate copolymer, the first functional group is a phenyl group and the second functional group is a carbonyl group. In the ethylene-vinyl acetate copolymer, the first functional group is an alkyl group and the second functional group is a carbonyl group. In the maleic anhydride-olefin copolymer, the first functional group is an alkyl group and the second functional group is a carbonyl group.

The adhesive may contain a solvent, in addition to the compound discussed. The solvent here may be at least one of the solvents which will be described as a first solvent and a second solvent below.

The stripping liquid according to the embodiment contains a first solvent and a second solvent. The second solvent has a polarity higher than that of the first solvent. The first solvent and the second solvent may be called a low-polar solvent and a high-polar solvent, respectively. The stripping liquid may be a mixed solvent formed only of the combination of the first solvent and the second solvent. The first and second solvents are, for example, organic solvents.

As the first solvent, for example, a solvent having a value of the Hildebrand solubility parameter (hereinafter "SP value") of 18.7 $MPa^{1/2}$ or below is employed. The first solvent is, for example, ethylbenzene, n-hexane, toluene, dipropylene glycol methyl ether (DMM), diethyl ether, methylcyclohexane, n-pentane, n-octane, o-xylene, p-xylene, m-xylene, or any mixture thereof.

It is preferable to use at least one selected from the group consisting of ethylbenzene, n-hexane, toluene, DMM, diethyl ether, and methylcyclohexane, as the first solvent. These solvents are relatively safe and available at low cost.

Note that ethylbenzene has a SP value of 17.9 $MPa^{1/2}$, n-hexane has a SP value of 14.9 $MPa^{1/2}$, toluene has a SP value of 18.2 $MPa^{1/2}$, DMM has a SP value of 17.7 $MPa^{1/2}$, diethyl ether has a SP value of 15.1 $MPa^{1/2}$, and methylcyclohexane has a SP value of 16.0 $MPa^{1/2}$.

It is more preferable to use at least one selected from the group consisting of ethylbenzene, n-hexane, toluene, and DMM, as the first solvent.

As the second solvent, for example, a solvent having a SP value higher than 19.0 $MPa^{1/2}$ is employed. The second solvent is, for example, propylene glycol methyl ether acetate (PGMEA), dioxane, N,N-dimethylformamide, aniline, or any mixture thereof.

It is preferable to use PGMEA as the second solvent. This solvent is relatively safe and available at low cost. Note that PGMEA has a SP value of 19.3 $MPa^{1/2}$.

According to a certain example, the ratio V1/V2 of the solvent contents in the stripping liquid, where V1 is a volume of the first solvent and V2 is a volume of the second solvent, is 0.25 or greater and 2 or below.

It is preferable to adjust the mixture ratio between the first solvent and the second solvent in the stripping liquid so that the Hansen solubility parameter (hereinafter, "HSP") of the stripping liquid approximates that of the adhesive.

An HSP represents the solubility of a given substance in the form of a three-dimensional vector. This vector is composed of an intermolecular dispersion component (van der Waals' force) dD ($MPa^{1/2}$), an intermolecular polar-bond component (dipole moment) dP ($Mpa^{1/2}$), and an intermolecular hydrogen-bond component dH ($MPa^{1/2}$). It can be assumed that the smaller the distance in HSP between the adhesive and the stripping liquid, the more soluble the adhesive in the stripping liquid.

FIG. 1 is a diagram for explaining a Hansen solubility parameter (HSP). FIG. 1 shows the dispersion component (van der Waals' force) dD, the polar-bond component (dipole moment) dP, and the hydrogen-bond component dH, applied to a three-dimensional space (HSP space). In FIG. 1, the solid vector indicates the HSP of the adhesive, and it is denoted by HSP [$dD_a$, $dP_a$, $dH_a$]. Also, the scalar quantity $SP_a$ of the adhesive's HSP is given by the following equation (1). Note that the scalar quantity $SP_a$ equals to the value of the Hildebrand solubility parameter (SP value), and therefore, it may be regarded as the SP value of the adhesive.

$$SP_a = \sqrt{(dD_a)^2 + (dP_a)^2 + (dH_a)^2} \qquad (1)$$

In FIG. 1, the dashed vector indicates the HSP of the stripping liquid, and it is denoted by HSP[$dD_b$, $dP_b$, $dH_b$]. Also, the scalar quantity $SP_b$ of the stripping liquid's HSP is given by the following equation (2). The scalar quantity $SP_b$ may be regarded as the SP value of the stripping liquid.

$$SP_b = \sqrt{(dD_b)^2 + (dP_b)^2 + (dH_b)^2} \qquad (2)$$

The distance $D_{ab}$ in HSP between the adhesive and the stripping liquid is obtained by the following equation (3). The HSP of the stripping liquid can be adjusted so that the distance $D_{ab}$ becomes preferably 7.7 $MPa^{1/2}$ or below, and more preferably 7 $MPa^{1/2}$ or below.

$$D_{ab}(MPa^{1/2}) = \sqrt{(dD_a - dD_b)^2 + (dP_a - dP_b)^2 + (dH_a - dH_b)^2} \qquad (3)$$

The stripping liquid according to the embodiment contains a mixed solvent of the first solvent and the second solvent. In the mixed solvent, the HSP of the first solvent is denoted by HSP[$dD_1$, $dP_1$, $dH_1$], and the HSP of the second solvent is denoted by HSP[$dD_2$, $dP_2$, $dH_2$]. Supposing that the volume ratio between the first solvent and the second solvent is a:b, the HSP of the mixed solvent, denoted by HSP [$dD_m$, $dP_m$, $dH_m$], is given by the following equation (4).

$$[dD_m, dP_m, dH_m] = [(a \times dD_1 + b \times dD_2), (a \times dP_1 + b \times dP_2), (a \times dH_1 + b \times dH_2)]/(a+b) \qquad (4)$$

Figure 2:
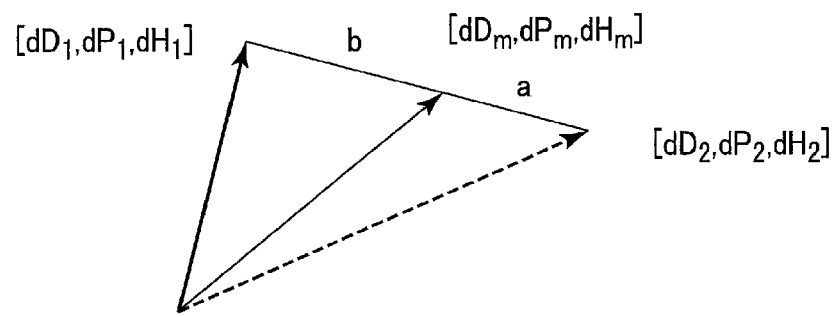
FIG. 2 is an explanatory diagram for explaining how to calculate the mixed solvent's HSP.

FIG. 2 is an explanatory diagram for explaining how to calculate the mixed solvent's HSP. In FIG. 2, the bold, solid arrow indicates the HSP vector of the first solvent, the thin, solid arrow indicates the HSP vector of the mixed solvent, and the dashed arrow indicates the HSP vector of the second solvent. The HSP vector of the mixed solvent may be understood as a position vector to the point that internally divides the line segment connecting the end point of the HSP vector of the first solvent with the end point of the HSP vector of the second solvent at the ratio of b:a.

Each solvent and each adhesive have their respective, unique HSP's. The HSP of each solvent can be confirmed through, for example, the database of Hansen solubility parameter software HSPiP (which stands for Hansen Solubility Parameter in Practice).

According to a certain example, ethylbenzene has an HSP[17.8, 0.6, 1.4], n-hexane has an HSP[14.9, 0, 0], toluene has an HSP[18, 1.4, 2], dipropylene glycol methyl ether (DMM) has HSP[15.8, 6.16, 4.93], and propylene glycol methyl ether acetate (PGMEA) has HSP[15.6, 5.6, 9.8].

The dispersion component dD of the stripping liquid is, according to a certain example, 15 $MPa^{1/2}$ or greater and 17 $MPa^{1/2}$ or below. The polar-bond component dP of the stripping liquid is, according to a certain example, 2 $MPa^{1/2}$ or greater and 9 $MPa^{1/2}$ or below. The hydrogen-bond component dH of the stripping liquid is, according to a certain example, 4 $MPa^{1/2}$ or greater and 9 $MPa^{1/2}$ or below.

According to a certain example, the SP value of the stripping liquid is 17 $MPa^{1/2}$ or greater and 22 $MPa^{1/2}$ or below.

The HSP of the adhesive can be calculated by, for example, the following method. First, the adhesive is immersed in multiple types of solvents each with a known HSP, and left untouched for a period of test time to verify its solubility. The types of solvents are, for example, 31 types, and the test time is, for example, 2 days. Upon elapse of the test time, the case where the adhesive has been completely dissolved is determined "soluble", and the case where the adhesive partially remains undissolved or the solvent has become clouded is determined "insoluble". The HSP's of the respective solvents and the solubility determination results for the adhesive are plotted in the HSP space. A sphere that yields the largest size in the HSP space is calculated on condition that the plots for the solvents with the "soluble" determination are embraced by the sphere while the plots for the solvents with the "insoluble" determination are excluded from the sphere. The coordinate at the center of this sphere is adopted as the HSP of the adhesive.

The dispersion component dD of the adhesive is, according to a certain example, 18 $MPa^{1/2}$ or greater and 19 $MPa^{1/2}$ or below. The polar-bond component dP of the adhesive is, according to a certain example, 8 $MPa^{1/2}$ or greater and 9 $MPa^{1/2}$ or below. The hydrogen-bond component dH of the adhesive is, according to a certain example, 5 $MPa^{1/2}$ or greater and 6 $MPa^{1/2}$ or below. The SP value of the adhesive is, for example, 20 $MPa^{1/2}$ or greater and 22 $MPa^{1/2}$ or below, and it is 21.3 $MPa^{1/2}$ according to a certain example.

The stripping liquid according to the embodiment may contain additives such as a surfactant, a preservative, and a stabilizer, in addition to the first solvent and the second solvent.

Next, description will be given of the stripping liquid suitable for use in the instances where the adhesive in the stack includes a compound including styrene-(meth)-acrylate copolymers.

A styrene-(meth)-acrylate copolymer has, as functional groups, a phenyl group (—$C_6H_5$) from the styrene, a methyl group (—$CH_3$), and a carbonyl group (—C=O) from the ester link (—COO—). The first functional group in a styrene-(meth)-acrylate copolymer is a phenyl group from the styrene, and the second functional group is a carbonyl group from the ester link.

A styrene-(meth)-acrylate copolymer has a structure expressed by, for example, the following formula (5).

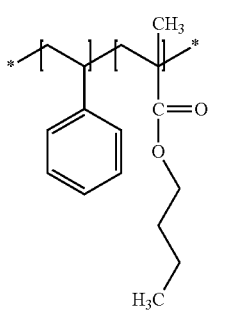
(5)

For example, an infrared spectroscopic analysis can be used to check if the adhesive contains a styrene-(meth)-acrylate copolymer. As an infrared spectroscopic analyzer, for example, FT/IR-6300 manufactured by Nihon Bunkou Kabushiki Kaisha (JASCO Corporation) or VERTEX80/80v manufactured by Bruker Optics (Bruker Corporation) may be employed. The analysis is performed with, for example, a measurement range of 500 cm$^{-1}$ or greater and 4000 cm$^{-1}$ or below, a resolution of 4 cm$^{-1}$, and accumulation times of 100. It is preferable to subject the obtained infrared spectrum to baseline correction and smoothing processing.

Figure 3:
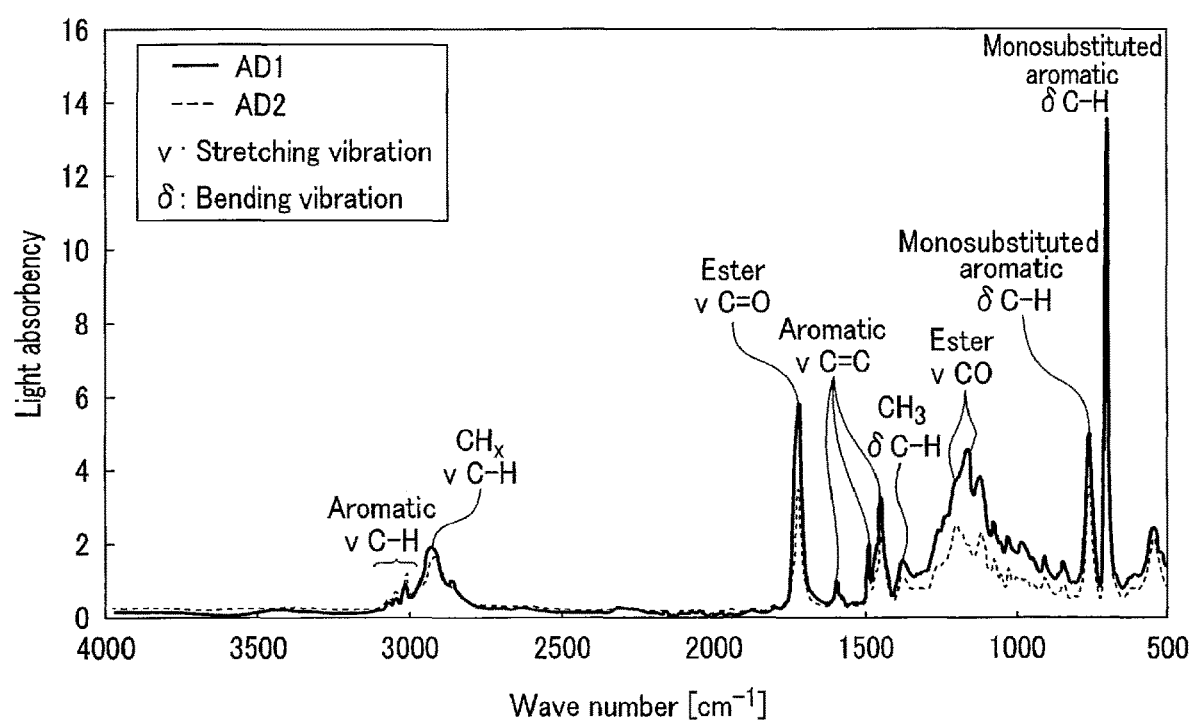
FIG. 3 is a graph showing an example of the infrared spectra of adhesives.

FIG. 3 is a graph showing an example of the infrared spectra of adhesives. In FIG. 3, the horizontal axis indicates the wave number (cm$^{-1}$), and the vertical axis indicates light absorbency. FIG. 3 shows the infrared spectra of adhesives AD1 and AD2 each containing styrene-(meth)-acrylate copolymers, using the solid and dashed wiggly lines, respectively. The adhesive AD2 contains styrene-(meth)-acrylate copolymers at a molecular weight higher than that of the adhesive AD1.

In FIG. 3, the peaks appearing at 3027 cm$^{-1}$, 3061 cm$^{-1}$, 3084 cm$^{-1}$, and 3101 cm$^{-1}$ are attributable to stretching vibrations of the C—H bonds of the aromatics. The peaks appearing at 2874 cm$^{-1}$ and 2947 cm$^{-1}$ are attributable to stretching vibrations of the C—H bonds of the alkanes (CH$_x$). The peaks appearing at 1728 cm$^{-1}$ are attributable to stretching vibrations of the C=O bonds of the ester links. The peaks appearing at 1493 cm$^{-1}$, 1584 cm$^{-1}$, and 1601 cm$^{-1}$ are attributable to stretching vibrations of the C=C bonds of the aromatics. The peaks appearing in the vicinity of 1384 cm$^{-1}$ are attributable to bending vibrations of the C—H bonds of the methyl groups (—CH$_3$). The peaks appearing at 1165 cm$^{-1}$, 1197 cm$^{-1}$, and 1283 cm$^{-1}$ are attributable to stretching vibrations of the C—O bonds of the ester links. The peaks appearing at 759 cm$^{-1}$ and 600 cm$^{-1}$ are attributable to bending vibrations of the C—H bonds of the monosubstituted aromatics.

When the peaks attributable to monosubstituted aromatics, ester links, and methyl groups appear as shown in FIG. 3, the presence of styrene-(meth)-acrylate copolymers can be assumed.

The dispersion component dD of a styrene-(meth)-acrylate copolymer is, according to a certain example, 18 MPa$^{1/2}$ or greater and 19 MPa$^{1/2}$ or below. The polar-bond component dP of a styrene-(meth)-acrylate copolymer is, according to a certain example, 8 MPa$^{1/2}$ or greater and 9 MPa$^{1/2}$ or below. The hydrogen-bond component dH of a styrene-(meth)-acrylate copolymer is, according to a certain example, 5 MPa$^{1/2}$ or greater and 6 MPa$^{1/2}$ or below. The SP value of a styrene-(meth)-acrylate copolymer is, for example, 20 MPa$^{1/2}$ or greater and 22 MPa$^{1/2}$ or below, and it is 21.3 MPa$^{1/2}$ according to a certain example.

As the first solvent in the stripping liquid for the adhesive containing styrene-(meth)-acrylate copolymers, it is preferable to use at least one selected from the group consisting of ethylbenzene, dipropylene glycol methyl ether (DMM), n-hexane, and toluene.

The structure of ethylbenzene is expressed by the following formula (6). Ethylbenzene has a phenyl group as shown in this formula (6), and therefore, it is assumed to have a high affinity with a styrene-(meth)-acrylate copolymer.

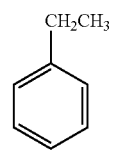
(6)

The structure of DMM is expressed by the following formula (7). DMM is an ether compound of low polarity as shown in this formula (7), and therefore, it is assumed to have a high affinity with a styrene-(meth)-acrylate copolymer.

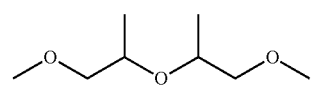
(7)

The structure of n-hexane is expressed by the following formula (8). As shown in the formula (8), n-hexane is a straight-chain hydrocarbon of low polarity; thus, it is assumed to have a high affinity with a styrene-(meth)-acrylate copolymer.

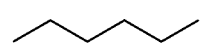
(8)

The structure of toluene is expressed by the following formula (9). Toluene has a phenyl group as shown in this formula (9), and therefore, it is assumed to have a high affinity with a styrene-(meth)-acrylate copolymer.

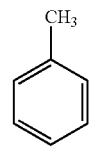
(9)

As the second solvent in the stripping liquid for the adhesive containing styrene-(meth)-acrylate copolymers, it is preferable to use propylene glycol methyl ether acetate (PGMEA). The structure of PGMEA is expressed by the following formula (10). PGMEA has a carbonyl group from the ester link as shown in the formula (10), and therefore, it is assumed to have a high affinity with a styrene-(meth)-acrylate copolymer.

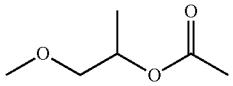
(10)

In the case where the stripping liquid adopts a mixed solvent of ethylbenzene and PGMEA, the ethylbenzene accounts for, for example, 10 volume %, 20 volume %, 30 volume %, 40 volume %, 50 volume %, 60 volume %, 70 volume %, 80 volume %, or 90 volume % of the mixed solvent.

The proportion of ethylbenzene in the mixed solvent is preferably 20 volume % or greater and 66.7 volume % or below. When the ethylbenzene proportion is within this range, adhesives containing styrene-(meth)-acrylate copolymers generally show a high rate of dissolution. When the ethylbenzene proportion is 50 volume %, this dissolution rate is generally maximized.

With the ethylbenzene proportion being within this range, the distance $D_{ab}$ in HSP between the styrene-(meth)-acrylate copolymer and the mixed solvent is 6.8 MPa$^{1/2}$ or greater and 7.3 MPa$^{1/2}$ or below. When the ethylbenzene proportion in the mixed solvent is 40 volume % or greater and 50 volume % or below, the distance $D_{ab}$ in HSP between the styrene-(meth)-acrylate copolymer and the mixed solvent is generally minimized, exhibiting a high correlation with the adhesives' rate of dissolution.

In the case where the stripping liquid adopts a mixed solvent of DMM and PGMEA, the DMM accounts for, for example, 10 volume %, 20 volume %, 30 volume %, 40 volume %, 50 volume %, 60 volume %, 70 volume %, 80 volume %, or 90 volume % of the mixed solvent.

The proportion of DMM in the mixed solvent is preferably 16.7 volume % or greater and 66.7 volume % or below. When the DMM proportion is within this range, adhesives containing styrene-(meth)-acrylate copolymers generally show a high rate of dissolution. When the DMM proportion is 33 volume %, this dissolution rate is generally maximized.

With the DMM proportion being within this range, the distance $D_{ab}$ in HSP between the styrene-(meth)-acrylate copolymer and the mixed solvent is 6.5 MPa$^{1/2}$ or greater and 7.6 MPa$^{1/2}$ or below. When the DMM proportion in the mixed solvent is 100 volume, the distance $D_{ab}$ in HSP between the styrene-(meth)-acrylate copolymer and the mixed solvent is generally minimized, exhibiting a low correlation with the adhesives' rate of dissolution.

In the case where the stripping liquid adopts a mixed solvent of n-hexane and PGMEA, the n-hexane accounts for, for example, 10 volume %, 20 volume %, 30 volume %, 40 volume %, 50 volume %, 60 volume %, 70 volume %, 80 volume %, or 90 volume % of the mixed solvent.

The proportion of n-hexane in the mixed solvent is preferably 10 volume % or greater and 50 volume % or below. When the n-hexane proportion is within this range, adhesives containing styrene-(meth)-acrylate copolymers generally show a high rate of dissolution. When the n-hexane proportion is 33.3 volume %, this dissolution rate is generally maximized.

With the n-hexane proportion being within this range, the distance $D_{ab}$ in HSP between the styrene-(meth)-acrylate copolymer and the mixed solvent is 8.06 MPa$^{1/2}$ or greater and 8.08 MPa$^{1/2}$ or below. When the n-hexane proportion in the mixed solvent is 10 volume % or greater and 20 volume % or below, the distance $D_{ab}$ in HSP between the styrene-(meth)-acrylate copolymer and the mixed solvent is generally minimized, exhibiting a low correlation with the adhesives' rate of dissolution.

In the case where the stripping liquid adopts a mixed solvent of toluene and PGMEA, the toluene accounts for, for example, 10 volume %, 20 volume %, 30 volume %, 40 volume %, 50 volume %, 60 volume %, 70 volume %, 80 volume %, or 90 volume % of the mixed solvent.

The proportion of toluene in the mixed solvent is preferably 33 volume % or greater and 66.7 volume % or below. When the toluene proportion is within this range, adhesives containing styrene-(meth)-acrylate copolymers generally show a high rate of dissolution. When the toluene proportion is 66.7 volume %, this dissolution rate is generally maximized.

With the toluene proportion being within this range, the distance $D_{ab}$ in HSP between the styrene-(meth)-acrylate copolymer and the mixed solvent is 6.4 MPa$^{1/2}$ or greater and 6.7 MPa$^{1/2}$ or below. When the toluene proportion in the mixed solvent is 50 volume %, the distance $D_{ab}$ in HSP between the styrene-(meth)-acrylate copolymer and the mixed solvent is generally minimized, exhibiting a low correlation with the adhesives' rate of dissolution.

The stripping liquid according to the embodiment as described above contains the first solvent and the second solvent differing in polarity. The stripping liquid is therefore suitable as a stripping liquid for adhesives containing two or more types of functional groups differing in polarity.

[Stripping Method and Electronic-Component Fabricating Method]

According to an embodiment, a stripping method and an electronic-component fabricating method each employing the stripping liquid of the foregoing embodiment include having this stripping liquid contact the aforementioned stack including a substrate, a support plate, and an adhesive, so as to remove the support plate from the stack. When the stripping liquid is brought into contact with the stack, the stripping liquid contacts the adhesive via, for example, through-holes in the support plate and from the side face of the stack. This causes dissolution or swelling of the adhesive so that the adhesive loses its function of bonding the substrate and the support plate together. Also, as the stripping liquid according to the embodiment having a high affinity with the adhesive, it can reduce the time required to remove the support plate from the stack, and realize easy removal of the support plate. Consequently, the stripping method and the electronic-component fabricating method according to the embodiment can improve efficiency in the fabrication of electronic components.

The electronic-component fabricating method may include the following steps.

First, a semiconductor wafer is prepared, with one of its major surfaces provided with semiconductor devices (e.g., transistors), electrodes, etc. An adhesive is applied over one major surface of the semiconductor wafer. The semiconductor wafer and the adhesive here may be those described above.

Subsequently, a support plate is placed on the semiconductor wafer's major surface on which the adhesive has been applied, so that a stack is obtained. The support plate here may be that described above. The stack is automatically conveyed by an automatic conveyance system, while the other major surface of the semiconductor wafer is subjected to a cutting process to form the semiconductor wafer into a thin plate.

Then, the stack and the stripping liquid of the embodiment are brought into contact with each other, and the support plate is removed from the stack. The semiconductor wafer is then cut into multiple semiconductor chips. These semiconductor chips are packaged, and electronic components are thus obtained.

Note that, instead of using the semiconductor wafer already provided with semiconductor devices (e.g., transistors), electrodes, etc., the method may be performed with a semiconductor wafer without them. That is, the method may proceed in such a manner that a stack is obtained by applying an adhesive on one major surface of the semiconductor wafer formed into a thin plate, and then this stack is conveyed and subjected to a process where the other major surface of the semiconductor wafer is provided with semiconductor devices, electrodes, etc.

Examples of the electronic components include discrete semiconductors, semiconductor integrated circuits (IC's), and semiconductor large-scale integrated circuits (LSI's). Such discrete semiconductors include transistors, diodes, and capacitors.

EXAMPLES

Description will be given of examples.

Example 1

A stripping liquid was prepared by mixing a first solvent and a second solvent. As the first solvent, ethylbenzene was employed. As the second solvent, propylene glycol methyl ether acetate (PGMEA) was employed. The ratio V1/V2 of the solvent contents in the stripping liquid, where V1 is a volume of the first solvent and V2 is a volume of the second solvent, was 0.1.

Example 2

A stripping liquid was prepared in the same manner as Example 1, except that the ratio V1/V2 was adjusted to be 0.5.

Example 3

A stripping liquid was prepared in the same manner as Example 1, except that the ratio V1/V2 was adjusted to be 1.0.

Example 4

A stripping liquid was prepared in the same manner as Example 1, except that the ratio V1/V2 was adjusted to be 1.5.

Example 5

A stripping liquid was prepared in the same manner as Example 1, except that the ratio V1/V2 was adjusted to be 2.0.

Example 6

A stripping liquid was prepared in the same manner as Example 1, except that the ratio V1/V2 was adjusted to be 3.0.

Example 7

A stripping liquid was prepared in the same manner as Example 1, except that dipropylene glycol methyl ether (DMM) was employed as the first solvent instead of ethylbenzene.

Example 8

A stripping liquid was prepared in the same manner as Example 7, except that the ratio V1/V2 was adjusted to be 0.2.

Example 9

A stripping liquid was prepared in the same manner as Example 7, except that the ratio V1/V2 was adjusted to be 0.25.

Example 10

A stripping liquid was prepared in the same manner as Example 7, except that the ratio V1/V2 was adjusted to be 0.5.

Example 11

A stripping liquid was prepared in the same manner as Example 7, except that the ratio V1/V2 was adjusted to be 1.0.

Example 12

A stripping liquid was prepared in the same manner as Example 7, except that the ratio V1/V2 was adjusted to be 2.0.

Example 13

A stripping liquid was prepared in the same manner as Example 1, except that n-hexane was employed as the first solvent instead of ethylbenzene, and that the ratio V1/V2 was adjusted to be 0.5.

Example 14

A stripping liquid was prepared in the same manner as Example 13, except that the ratio V1/V2 was adjusted to be 1.0.

Example 15

A stripping liquid was prepared in the same manner as Example 1, except that toluene was employed as the first solvent instead of ethylbenzene, and that the ratio V1/V2 was adjusted to be 0.5.

Example 16

A stripping liquid was prepared in the same manner as Example 15, except that the ratio V1/V2 was adjusted to be 1.0.

Example 17

A stripping liquid was prepared in the same manner as Example 15, except that the ratio V1/V2 was adjusted to be 2.0.

Comparative Example 1

As a stripping liquid, PGMEA was used.

Comparative Example 2

As a stripping liquid, ethylbenzene was used.

Comparative Example 3

As a stripping liquid, DMM was used.

Comparative Example 4

As a stripping liquid, n-hexane was used.

Comparative Example 5

As a stripping liquid, toluene was used.
[Evaluation Method]
<Calculating Distances in HSP Between Adhesive and Stripping Liquids>

The HSP's and the SP values of an adhesive and the stripping liquids were calculated through the method described above. As a result, the adhesive was found to have HSP[18.6, 8.8, 5.3] and a SP value of 21.3 $MPa^{1/2}$. Also, the distance $D_{ab}$ in HSP between the adhesive and each stripping liquid was calculated. The results are shown in Table 1.

<Measuring Rates of Dissolution>

Figure 4:
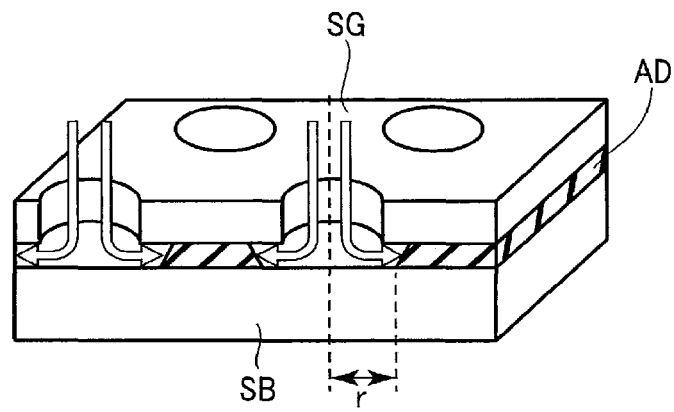
FIG. 4 is an explanatory diagram for explaining how to measure the adhesive's dissolution rate.

The rate of dissolution of the adhesive was measured through the method as shown in FIG. 4. FIG. 4 is an explanatory diagram for explaining how to measure the adhesive's dissolution rate.

First, a substrate SB, an adhesive AD, and a support plate SG were prepared. As the substrate SB, a square-shaped silicon wafer having a 20 mm length on one side and a 0.75 mm thickness was used. As the adhesive AD, an adhesive containing styrene-(meth)-acrylate copolymers was used. As the support plate SG, a square-shaped, alkali-free glass plate having a 20 mm length on one side and a 0.66 mm thickness was used. The support plate SG had multiple through-holes each having a 300 μm diameter and penetrating in the thickness direction.

The adhesive AD is applied over one major surface of the substrate SB and the support plate SG is placed on the adhesive AD so that a stack as shown in FIG. 4 was obtained. The stack was cut in its stacking direction, and each test sample was thus obtained.

Subsequently, the subject stripping liquid was poured into a beaker and the test sample was immersed in this stripping liquid. The stripping liquid was used at room temperature. The test was performed while stirring the stripping liquid at a rate of 100 rpm.

Upon elapse of a given time; the test sample was taken out from the stripping liquid and observed with an optical microscope from the side of the support plate SG. As a result, it was confirmed that part of the adhesive AD on the substrate SB was dissolved concentrically with the circular profile of the through-hole. This was assumed to be due to the stripping liquid having entered the inside of the stack from the through-hole of the support plate SG as illustrated by arrows in FIG. 4. A radius r from the point corresponding to the center of the through-hole of the support plate SG to the outermost periphery of the portion of the substrate SB that was exposed after the removal of the adhesive AD was measured. Table 2 shows the elapsed times adopted.

Data from each example and comparative example was then plotted on a graph indicating the elapsed time by the horizontal axis and the radius r by the vertical axis, and an approximate line for each example and comparative example was obtained. The inclination of this approximate line was adopted as a representation of the adhesive's dissolution rate in each example and comparative example. The results are shown in Table 2.

TABLE 1

| | First solvent | Second solvent | mixture volume ratio (V1:V2) | SP value ($MPa^{1/2}$) | dD ($MPa^{1/2}$) | dP ($MPa^{1/2}$) | dH ($MPa^{1/2}$) | Distance $D_{ab}$ ($MPa^{1/2}$) |
|---|---|---|---|---|---|---|---|---|
| Example 1 | ethylbenzene | PGMEA | 1:10 | 18.9 | 15.8 | 5.1 | 9.0 | 7.7 |
| Example 2 | ethylbenzene | PGMEA | 5:10 | 18.2 | 16.3 | 3.9 | 7.0 | 6.9 |
| Example 3 | ethylbenzene | PGMEA | 10:10 | 17.9 | 16.7 | 3.1 | 5.6 | 6.9 |
| Example 4 | ethylbenzene | PGMEA | 15:10 | 17.8 | 16.9 | 2.6 | 4.8 | 7.1 |
| Example 5 | ethylbenzene | PGMEA | 20:10 | 17.7 | 17.1 | 2.3 | 4.2 | 7.3 |
| Example 6 | ethylbenzene | PGMEA | 30:10 | 17.7 | 17.3 | 1.9 | 3.5 | 7.7 |
| Example 7 | DMM | PGMEA | 1:10 | 19.1 | 15.6 | 5.7 | 9.4 | 7.9 |
| Example 8 | DMM | PGMEA | 2:10 | 18.9 | 15.6 | 5.7 | 9.0 | 7.6 |
| Example 9 | DMM | PGMEA | 2.5:10 | 18.8 | 15.6 | 5.7 | 8.8 | 7.6 |
| Example 10 | DMM | PGMEA | 5:10 | 18.6 | 15.7 | 5.8 | 8.2 | 7.2 |
| Example 11 | DMM | PGMEA | 10:10 | 18.3 | 15.7 | 5.9 | 7.4 | 6.8 |
| Example 12 | DMM | PGMEA | 20:10 | 18.1 | 15.7 | 6.0 | 6.6 | 6.5 |
| Example 13 | n-hexane | PGMEA | 5:10 | 17.1 | 15.4 | 3.7 | 6.5 | 8.3 |
| Example 14 | n-hexane | PGMEA | 10:10 | 16.3 | 15.3 | 2.8 | 4.9 | 9.0 |
| Example 15 | toluene | PGMEA | 5:10 | 18.4 | 16.4 | 4.2 | 7.2 | 6.6 |
| Example 16 | toluene | PGMEA | 10:10 | 18.1 | 16.8 | 3.5 | 5.9 | 6.4 |
| Example 17 | toluene | PGMEA | 20:10 | 18.0 | 17.2 | 2.8 | 4.6 | 6.7 |
| Comparable Example 1 | — | PGMEA | 0:10 | 19.3 | 15.6 | 5.6 | 9.8 | 8.2 |
| Comparable Example 2 | ethylbenzene | — | 10:0 | 17.9 | 17.8 | 0.6 | 1.4 | 17.9 |
| Comparable Example 3 | DMM | — | 10:0 | 17.7 | 15.8 | 6.2 | 4.9 | 6.25 |
| Comparable Example 4 | n-hexane | — | 10:0 | 14.9 | 14.9 | 0.0 | 0.0 | 12.7 |

TABLE 1-continued

| | First solvent | Second solvent | mixture volume ratio (V1:V2) | SP value ($MPa^{1/2}$) | dD ($MPa^{1/2}$) | dP ($MPa^{1/2}$) | dH ($MPa^{1/2}$) | Distance $D_{ab}$ ($MPa^{1/2}$) |
|---|---|---|---|---|---|---|---|---|
| Comparable Example 5 | toluene | — | 10:0 | 18.2 | 18.0 | 1.4 | 2.0 | 8.22 |

TABLE 2

| | Radius r (µm) after adhesive dissolution | | | | | | | rate (µm/min) |
|---|---|---|---|---|---|---|---|---|
| | 1 min | 3 min | 5 min | 7 min | 10 min | 15 min | 20 min | |
| Example 1 | — | — | — | 153.450 | 161.750 | 215.763 | — | 8.097 |
| Example 2 | 183.050 | 216.138 | 236.125 | — | 261.813 | — | — | 8.243 |
| Example 3 | 168.925 | 187.425 | 230.025 | — | — | — | — | 15.275 |
| Example 4 | — | 151.988 | 182.800 | 208.913 | — | — | — | 14.231 |
| Example 5 | 176.263 | 193.338 | 218.388 | — | — | — | — | 10.531 |
| Example 6 | 153.200 | 178.825 | — | 217.225 | — | — | — | 10.518 |
| Example 7 | — | 152.988 | 168.013 | 181.238 | — | — | — | 7.063 |
| Example 8 | — | 150.500 | 167.363 | 185.650 | — | — | — | 8.788 |
| Example 9 | — | 150.975 | 166.275 | 191.838 | — | — | — | 10.216 |
| Example 10 | — | 173.475 | 216.569 | 237.500 | — | — | — | 16.006 |
| Example 11 | — | 176.819 | 201.050 | 223.281 | — | — | — | 11.616 |
| Example 12 | — | 196.606 | 216.994 | 233.381 | — | — | — | 9.194 |
| Example 13 | 149.138 | 196.400 | 211.300 | — | — | — | — | 15.540 |
| Example 14 | 156.163 | 184.238 | 220.638 | — | 238.475 | — | — | 8.919 |
| Example 15 | 161.213 | 188.563 | 195.125 | — | 239.938 | — | — | 8.356 |
| Example 16 | 154.892 | 160.150 | 200.850 | — | — | — | — | 11.490 |
| Example 17 | 155.600 | 207.188 | 276.638 | — | — | — | — | 29.075 |
| Comparable Example 1 | — | — | 146.450 | — | 171.638 | — | 235.700 | 6.015 |

Figure 5:
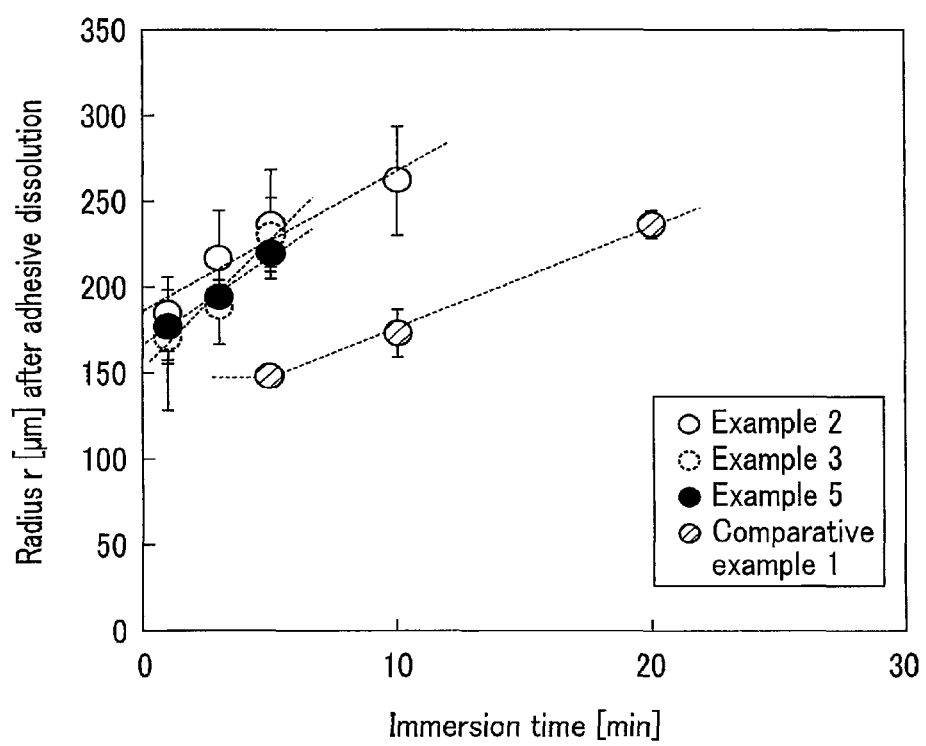
FIG. 5 is a graph showing one example of the relationship between the immersion time and the radius r that appeared after dissolution of the adhesive.

FIG. 5 is a graph showing one example of the relationship between the immersion time and the radius r that appeared after dissolution of the adhesive. In FIG. 5, the horizontal axis indicates the elapsed time since a test sample was placed in the state of immersion in the stripping liquid, and the vertical axis indicates the radius r from the point corresponding to the center of the through-hole of the support plate SG to the outermost periphery of the portion of the substrate SB that was exposed after the removal of the adhesive AD. FIG. 5 is based on the data from Examples 2, 3, and 5, and Comparative Example 1. As evident from FIG. 5 and Table 2, the use of the stripping liquids according to Examples 2, 3, and 5 has improved the adhesive's dissolution rate as compared to the use of the stripping liquid according to Comparative Example 1.

Figure 6:
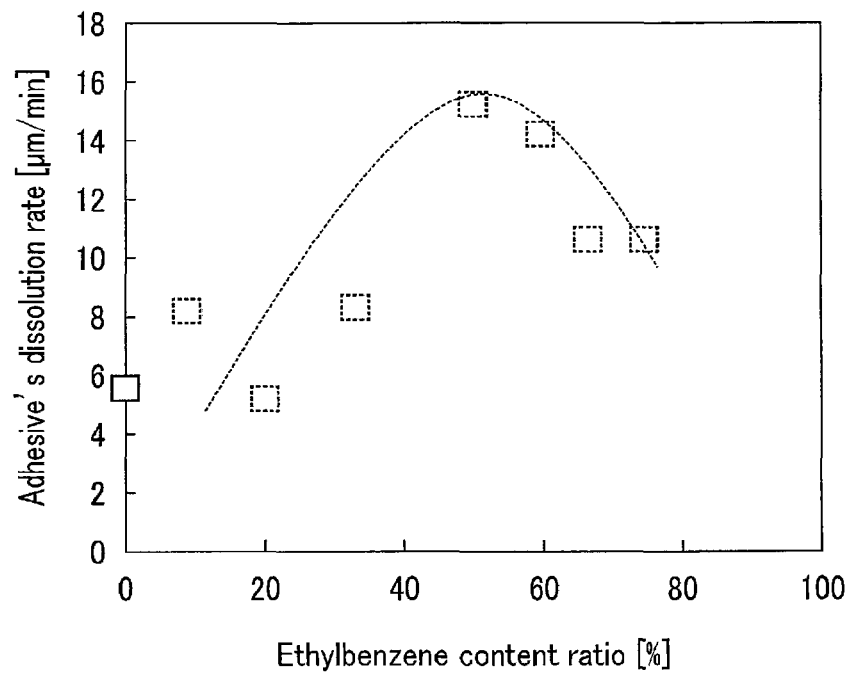
FIG. 6 is a graph showing one example of the relationship between the content ratio of ethylbenzene and the adhesive's dissolution rate.

FIG. 6 is a graph showing one example of the relationship between the content ratio of ethylbenzene and the adhesive's dissolution rate. In FIG. 6, the horizontal axis indicates the volume percent of ethylbenzene in the stripping liquid and the vertical axis indicates the adhesive's dissolution rate. FIG. 6 is based on the data from Examples 1 to 6, and Comparative Examples 1 and 2. As evident from FIG. 6 and Table 2, the adhesive's dissolution rate was excellent when the content ratio of ethylbenzene was 40 volume % or greater and 60 volume % or below.

Figure 7:
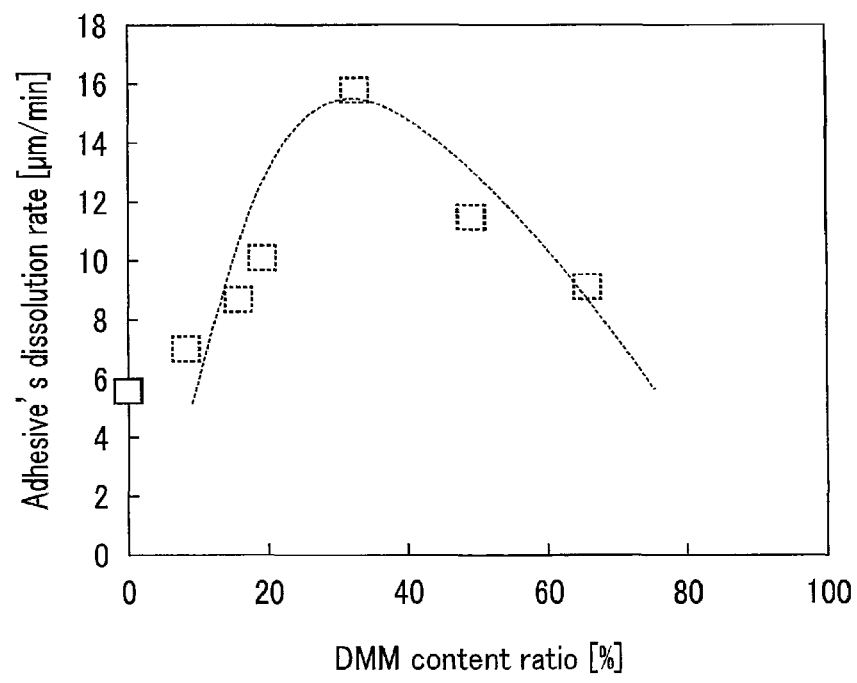
FIG. 7 is a graph showing one example of the relationship between the content ratio of dipropylene glycol methyl ether (DMM) and the adhesive's dissolution rate.

FIG. 7 is a graph showing one example of the relationship between the content ratio of dipropylene glycol methyl ether (DMM) and the adhesive's dissolution rate. In FIG. 7, the horizontal axis indicates the volume percent of DMM in the stripping liquid and the vertical axis indicates the adhesive's dissolution rate. FIG. 7 is based on the data from Examples 7 to 12, and Comparative Examples 1 and 3. As evident from FIG. 7 and Table 2, the adhesive's dissolution rate was excellent when the content ratio of DMM was 30 volume % or greater and 40 volume % or below.

Figure 8:
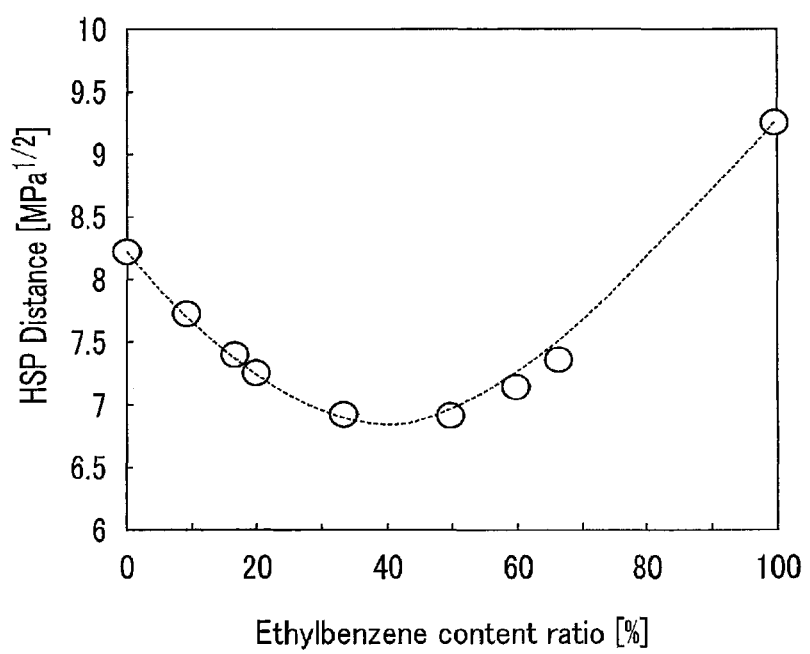
FIG. 8 is a graph showing one example of the relationship between the content ratio of ethylbenzene and the HSP distance.

FIG. 8 is a graph showing one example of the relationship between the content ratio of ethylbenzene and the HSP distance. In FIG. 8, the horizontal axis indicates the volume percent of ethylbenzene in the stripping liquid and the vertical axis indicates the distance $D_{ab}$ in HSP between the adhesive and the stripping liquid. FIG. 8 is based on the data from Examples 1 to 6, and Comparative Examples 1 and 2. As evident from FIG. 8 and Table 2, the HSP distance $D_{ab}$ was minimized when the content ratio of ethylbenzene was 40 volume % or greater and 50 volume % or below. As evident from FIG. 6 and FIG. 8 taken into consideration altogether, when the mixed solvent of ethylbenzene and PGMEA was adopted as a stripping liquid, there was a correlation between the HSP distance $D_{ab}$ and the adhesive's dissolution rate.

The stripping liquid according to at least one embodiment as described above contains the first solvent and the second solvent differing in polarity. The stripping liquid is therefore suitable as a stripping liquid for adhesives containing two or more types of functional groups differing in polarity.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of fabricating an electronic component, comprising:
   providing a stack comprising a substrate, a support plate, and an adhesive placed between the substrate and the support plate, the adhesive comprising a styrene-(meth)-acrylate copolymer;
   preparing a stripping liquid consisting of a mixed solvent of a first solvent and a second solvent, the first solvent being selected from the group consisting of ethylbenzene, n-hexane, toluene, and dipropylene glycol methyl ether, and the second solvent being propylene glycol methyl ether acetate; and
   bringing the stack into contact with the stripping liquid, thereby removing the support plate from the stack.

2. The method according to claim 1, wherein a ratio V1/V2 is 0.25 or greater and 2 or below, where V1 is a volume of the first solve and V2 is a volume of the second solvent.

3. The method according to claim 1, wherein the stripping liquid has a dispersion component dD of 15 $MPa^{1/2}$ or greater and 17 $MPa^{1/2}$ or below, a polar-bond component dP of 2 $MPa^{1/2}$ or greater and 9 $MPa^{1/2}$ or below, and a hydrogen-bond component dH of 4 $MPa^{1/2}$ or greater and 9 $MPa^{1/2}$ or below as Hansen solubility parameters.

4. The method according to claim 1, wherein the stripping liquid has a solubility parameter value of 17 $MPa^{1/2}$ or greater and 22 $MPa^{1/2}$ or below.

5. The method according to claim 1, wherein the substrate is a semiconductor wafer, and the support plate is of a material selected from the group consisting of a glass material, a resin material, and a metal material.

6. The method according to claim 5, wherein the support plate has through-holes.

7. A stripping liquid, consisting of a mixed solvent of a first solvent and second solvent, the first solvent being selected from the group consisting of ethylbenzene, n-hexane, toluene, and dipropylene glycol methyl ether, and the second solvent being propylene glycol methyl ether acetate.

8. The stripping liquid according to claim 7, wherein a ratio V1/V2 is 0.25 or greater and 2 or below, where V1 is a volume of the first solvent and V2 is a volume of the second solvent.

9. The stripping liquid according to claim 7, wherein the stripping liquid has a dispersion component dD of 15 $MPa^{1/2}$ or greater and 17 $MPa^{1/2}$ or below, a polar-bond component dP of 2 $MPa^{1/2}$ or greater and 9 $MPa^{1/2}$ or below, and a hydrogen-bond component dH of 4 $MPa^{1/2}$ or greater and 9 $MPa^{1/2}$ or below as Hansen solubility parameters.

10. The s g liquid according to claim 7, herein the stripping liquid has a solubility parameter value of 17 $MPa^{1/2}$ or greater and 22 $MPa^{1/2}$ or below.

* * * * *